(12) United States Patent
Okamura et al.

(10) Patent No.: US 6,387,502 B1
(45) Date of Patent: May 14, 2002

(54) DIAMOND-COATED HARD METAL MEMBER

(75) Inventors: Takashi Okamura, Aichi; Satoshi Iio, Gifu; Hiromi Saguchi, Aichi, all of (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 09/389,010

(22) Filed: Sep. 2, 1999

(30) Foreign Application Priority Data

Sep. 4, 1998 (JP) .............................. 10-251177

(51) Int. Cl.⁷ ................................................ B32B 9/00
(52) U.S. Cl. ...................... 428/408; 428/469; 51/295; 51/307; 51/309
(58) Field of Search ................................ 428/408, 469, 428/612, 698, 699, 701, 702, 634; 76/DIG. 12

(56) References Cited

U.S. PATENT DOCUMENTS

| 5,164,051 A | | 11/1992 | Komaki et al. | |
|---|---|---|---|---|
| 5,204,167 A | * | 4/1993 | Saijo et al. | 428/212 |
| 5,328,761 A | | 7/1994 | Omori et al. | |
| 5,391,422 A | | 2/1995 | Omori et al. | |
| 5,585,176 A | * | 12/1996 | Grab et al. | 428/336 |
| 5,851,658 A | | 12/1998 | Yamamoto et al. | |

FOREIGN PATENT DOCUMENTS

| JP | 3-107460 | 5/1991 |
|---|---|---|
| JP | 3-146663 | 6/1991 |
| JP | 3-183774 | 8/1991 |
| JP | 4-221075 | 8/1992 |
| JP | 4-263074 | 9/1992 |
| JP | 8-92741 | 4/1996 |
| JP | 9-20590 | 1/1997 |
| JP | 0 864 668 | 9/1998 |

* cited by examiner

Primary Examiner—Deborah Jones
Assistant Examiner—Gwendolyn Blackwell-Rudasill
(74) Attorney, Agent, or Firm—Armstrong, Westerman & Hattori, LLP

(57) ABSTRACT

A diamond-coated hard metal member comprising a WC-based hard metal substrate having a roughened surface formed by electrolytic etching and a diamond coat layer coating the roughened surface with an interlayer provided interposed therebetween. The interlayer coats the substrate, and is a W layer having a roughened surface corresponding to the roughened surface of the substrate. The unetched substrate comprises disperse phases dispersed therein in an amount of from 2 to 5 mol-%, and has disperse phases having an average longest diameter of from not less than 0.5 $\mu$m to less than 2 $\mu$m on the surface thereof in a density of from not less than $0.1/\mu m^2$ to not more than $0.2/\mu m^2$.

9 Claims, 3 Drawing Sheets

FIG. 1

DISPERSE PHASE ⟶ LARGE

FIG. 2

DISPERSE PHASE ⟶ SMALL

DIAMOND-COATED HARD METAL MEMBER

BACKGROUND OF THE INVENTION

1. Field of the Invention

The present invention relates to a diamond-coated hard metal member exhibiting excellent peeling resistance and good adhesion. More particularly, the present invention relates to a diamond-coated hard metal member that can be used as a cutting tool, such as a milling machine, a single point tool, an end mill, a cutter or a drill, or to a diamond-coated hard member such as an abrasion-resistant member.

2. Description of the Related Art

If a WC-based hard metal substrate is coated with a diamond coat layer, the diamond coat layer can easily peel off the substrate because the two components have largely different thermal expansion coefficients or do not chemically bind to one another. As a countermeasure for preventing peeling of the diamond coat layer, an anchoring effect resulting from a fine roughness formed on the substrate surface has been known to be effective in enhancing the adhesion between the substrate and the diamond coat layer. In particular, a useful technique comprises electrolytically etching the surface of the substrate in such a manner that the surface can be uniformly roughened without significantly damaging the substrate, regardless of the shape of the substrate, and then coating the roughened surface with a diamond coat layer. Extensive studies of this type of technique have been made in an attempt to obtain better adhesion between the substrate and the diamond coat layer.

(1) Processes for controlling the degree of roughness formed on the substrate according to electrolytic etching conditions include the following: (a) a technique employing a specific electrolytic solution, as disclosed in JP-A-03-107460 (The term "JP-A" as used herein means an "unexamined published Japanese patent application") and JP-A-03-146663; (b) a technique of predetermining the etching rate, as disclosed in JP-A-09-020590; and (c) a technique of predetermining a process for applying voltage, as disclosed in JP-A-03-183774.

(2) A technique involving predetermining the hard metal to be electrolytically etched as a starting material, as disclosed in JP-A-04-221075.

(3) A technique of embedding a component as a projection from the surface of a hard metal substrate to be coated with a diamond coat layer, as disclosed in JP-A-08-092741.

However, the foregoing related techniques do not result in sufficient peeling-resistance of the diamond coat layer formed on the roughened surface of the hard metal substrate.

A related technique for controlling the roughness comprises predetermining the electrolytic solution or treatment conditions such that a surface roughness having a sufficient anchoring effect can be formed, without impairing the shape of the WC-based hard metal substrate (e.g., without rendering the blade dull). However, this technique may not result in a surface roughness that can withstand heavy-duty cutting.

In order to form a surface roughness, having a good anchoring effect, on a hard metal substrate, there has been disclosed a method involving the use of a disperse phase component having a high aspect ratio as a hard metal substrate material. There has also been disclosed a method of attaching to the surface of a hard metal substrate a particulate component which, after electrolytic etching, remains projecting from the substrate. However, neither of these two methods can sufficiently achieve the desired result.

SUMMARY OF THE INVENTION

An object of the present invention is to solve the foregoing problems of the related art.

It is a further object of the present invention to provide a diamond-coated hard metal member having excellent abrasion resistance and adhesiveness good enough to withstand an impact resulting when the element is used as a cutting tool for heavy-duty cutting, such as the milling of an aluminum alloy.

In accordance with the first aspect of the present invention, there is provided a diamond-coated hard metal member comprising a hard metal substrate having a roughened surface and a diamond coat layer coating the roughened surface, either directly or with an interlayer interposed therebetween. The interlayer contains a metal or compound thereof, coats the substrate, has a roughened surface corresponding to the roughened surface of the substrate, and has fine projections having an average longest diameter of not more than 3.2 $\mu$m at the base thereof in a density as high as not less than $0.08/\mu m^2$.

In accordance with the second aspect of the present invention, there is provided a diamond-coated hard metal member comprising a hard metal substrate having a roughened surface and a diamond coat layer coating the roughened surface, either directly or with an interlayer interposed therebetween. The interlayer contains a metal or compound thereof, coats the substrate, and has a roughened surface corresponding to the roughened surface of the substrate, which is obtained by electrolytically etching a WC-based hard metal substrate comprising WC as a main component. The unetched substrate contains a metal element or compound thereof, and comprises a disperse phase having a sufficiently lower electrolytic etching rate than WC dispersed therein in a surface region to at least a thickness that can be electrolytically etched in an amount of from 2 to 5 mol-% as calculated in terms of the metal element. The surface of the unetched substrate has small diameter disperse phases having an average longest diameter of from not less than 0.5 $\mu$m to less than 2 $\mu$m in a density of from not less than $0.1/\mu m^2$ to not more than $0.2/\mu m^2$, or large diameter disperse phases having an average longest diameter of from not less than 2 $\mu$m to not more than 3 $\mu$m in a density of from not less than $0.03/\mu m^2$ to not more than $0.1/\mu m^2$.

The second aspect of the present invention can further include the roughened surface of the substrate having fine projections having an average longest diameter of not more than 3.2 $\mu$m at the base thereof in a density as high as not less than $0.08/\mu m^2$.

The disperse phase can contain at least one metal element selected from the group consisting of elements belonging to the Groups IVa, Va and VIa (excluding W) of the periodic table of elements, or a compound thereof.

The reason why the foregoing related art cannot necessarily provide a roughened surface that can sufficiently withstand heavy-duty cutting under some electrolytic etching conditions for controlling the form of surface roughness of hard metal substrate will now be described.

Electrolytic etching makes the use of the difference in electrical solubility between the components constituting a hard metal substrate. In the case of a WC-based hard metal substrate for example, a roughened surface is formed with disperse phases as projections because disperse phase components are electrolytically etched away at a remarkably lower rate than WC and binding phase ($\gamma$-phase) components (one or more of Co and Ni). Therefore, the number and size of projections on the roughened surface formed by electrolytic etching depend not only on the electrolytic etching conditions, but also on the surface structure of the hard metal substrate. In the related art, the surface structure of an unetched hard metal substrate to which a diamond layer can be sufficiently attached has not been definitely disclosed.

The inventors focused on the fact that the form of roughness on the surface of an electrolytically etched hard metal substrate depends on the content of disperse phase in the surface layer region (at least to a depth that can be electrolytically etched) of unetched hard metal substrate, and also on the size and density of disperse phases on the surface of the substrate. These factors thus have a great effect on the adhesion of the diamond coat layer. The inventors conducted electrolytic etching of a hard metal substrate, the surface layer region of which has a predetermined composition and structure at least to a depth that can be electrolytically etched, and then formed a diamond layer on the roughened surface of the hard metal substrate. It was found that the diamond layer thus formed has an adhesion good enough to withstand impact developed when the element is used as a cutting tool for heavy-duty cutting, such as milling of aluminum alloy.

The numerical range as used herein contains not only both extreme values, but also all arbitrary intermediate values contained therein, unless specifically stated otherwise.

The entire disclosure of each and every foreign patent application from which the benefit of foreign priority has been claimed in the present application is incorporated herein by reference, as if fully set forth.

DETAILED DESCRIPTION OF THE INVENTION

[Diamond-coated Hard Metal Member According to the First Aspect of the Present Invention]

A diamond-coated hard metal member according to the first aspect of the present invention comprises a hard metal substrate having a roughened surface and a diamond coat layer coating the roughened surface, either directly or with an interlayer interposed therebetween.

The foregoing interlayer coats the hard metal substrate, contains a metal or metal compound, and has a roughened surface corresponding to the roughened surface of the substrate. There may be provided two or more interlayers between the roughened hard metal substrate and the roughened diamond coat layer, rather than a single interlayer, so long as the effect of the present invention is not impaired.

[Hard Metal Substrate Having Roughened Surface]

The roughened surface of the hard metal substrate has fine projections having an average longest diameter of not more than 3.2 $\mu$m, preferably 0.5 to 3.2 $\mu$m, more preferably 0.8 to 3.0 $\mu$m, most preferably 0.9 to 2.8 $\mu$m at the base thereof, in a density as high as not less than 0.8/$\mu$m$^2$, preferably 0.08/$\mu$m$^2$ to 0.25/$\mu$m$^2$, more preferably 0.10/$\mu$m$^2$ to 0.20/$\mu$m$^2$, most preferably 0.12/$\mu$m$^2$ to 0.18/$\mu$m$^2$.

The hard metal substrate is preferably a WC based hard metal comprising WC as a main component, and one or more of Co and Ni as a binding phase component. Thus, the hard metal substrate can comprise a disperse phase having a lower electrolytic etching rate than the WC dispersed therein. The foregoing disperse phase can contain a metal element or metal compound. The disperse phase can also be a disperse phase in the diamond-coated hard metal member of the second aspect of the present invention described later.

[Diamond Coat Layer]

The thickness of the diamond coat layer may be from 5 to 50 $\mu$m, more preferably from 10 to 40 $\mu$m, even more preferably from 20 to 35 $\mu$m.

[Interlayer]

The interlayer contains a metal or metal compound, and preferably at least one metal element selected from the group consisting of the elements belonging to Groups IVa (Ti, Zr, Hf), Va (V, Nb, Ta) and VIa (Cr, Mo, W) and Si, of the periodic table of elements.

More preferably, the interlayer is made of one or more materials selected from the following three groups:

(1) One or more metals selected from the group consisting of the metals belonging to the Groups IVa, Va and VIa of the periodic table of elements and Si;

(2) Compounds selected from the group consisting of a carbide, nitride, boride and oxide, of the above-listed metals (e.g., a metal carbide), or mixture of two or more of these compounds; and (3) Compounds produced by combining two or more of these carbides, nitrides, borides and oxides, or a mixture of two or more of these compounds.

The roughened surface of the interlayer preferably has fine projections having an average longest diameter of not more than 3.2 $\mu$m, preferably 0.5 to 3.2 $\mu$m, more preferably 0.8 to 3.0 $\mu$m , most preferably 0.9 to 2.8 $\mu$m at the base thereof, in a density as high as not less than 0.08/$\mu$m$^2$, preferably 0.08/$\mu$m$^2$ to 0.25/$\mu$m$^2$, more preferably 0.10/$\mu$m$^2$ to 0.20/$\mu$m$^2$, most preferably 0.12/$\mu$m to 0.18/$\mu$m$^2$.

The interlayer, provided on and coating the roughened surface of the hard metal substrate, and having a roughened surface corresponding to the roughened surface of the substrate, has a thickness of preferably from 0.1 to 0.5 $\mu$m, more preferably from 0.15 to 0.4 $\mu$m, and even more preferably from 0.2 to 0.3 $\mu$m.

[Diamond-Coated Hard Metal Member According to the Second Aspect of the Present Invention]

The diamond-coated hard metal member according to the second aspect of the present invention comprises a hard metal substrate having a roughened surface and a diamond coat layer coating the roughened surface, either directly or with an interlayer interposed therebetween. The foregoing roughened surface of the substrate is obtained by electrolytically etching a WC-based hard metal substrate comprising WC as a main component.

The foregoing interlayer contains a metal or metal compound, has a roughened surface corresponding to the roughened surface of the hard metal substrate, and coats the roughened surface of the substrate. Rather than a single interlayer, two or more interlayers may be provided between the roughened hard metal substrate and the roughened diamond coat layer, so long as the effect of the present invention is not impaired.

[Unetched Hard Metal Substrate]

(1) The unetched substrate has a metal element or metal compound, and comprises a disperse phase having a sufficiently lower electrolytic etching rate than the WC dispersed therein in a surface region to at least a thickness that can be electrolytically etched (at least not less than 10 μm, preferably not less than 15 μm, more preferably not less than 20 μm, and even more preferably not less than 25 μm from the surface) and in an amount of 2 to 5 mol-%, but preferably from 2.5 to 3.5 mol-%, as calculated in terms of the metal element therein. The foregoing disperse phase can be uniformly dispersed in the foregoing unetched substrate.

(2) The surface of the unetched substrate has small diameter disperse phases (i.e., small diameter disperse phase particles) having an average longest diameter of from not less than 0.5 μm to less than 2 μm in a density of not less than $0.1/\mu m^2$ to not more than $0.2/\mu m^2$, and preferably less than $0.2/\mu m^2$, or large diameter disperse phases having an average longest diameter of from not less than 0.2 μm to not more than 3 μm, preferably less than 3 μm, in a density of from not less than $0.03/\mu m^2$ to not more than $0.1/\mu m^2$, and preferably less than $0.1/\mu m^2$.

The hard metal substrate can be electrolytically etched to form a roughened surface thereon, wherein the surface has uniform, fine projections of high density to thereby result in a surface having an extremely high anchoring effect. In particular, since fine roughness having an average longest diameter of not more than 3.2 μm at the base of the projection (i.e., bottom of the projection portion) can be formed at the surface of the substrate in a density as high as not less than $0.08/\mu m^2$, an extremely high anchoring effect can be achieved. Accordingly, a hard metal member comprising a diamond coat layer having excellent peeling resistance can be produced.

If the amount of the foregoing specific disperse phase (disperse phase containing a metal element or metal compound) dispersed in the surface layer region of the substrate to a depth that can be electrolytically etched falls below 2 mol-%, the number of projections in the roughened surface formed by electrolytic etching is reduced, making it impossible to achieve a sufficient anchoring effect. On the contrary, if the disperse phase exceeds 5 mol-%, the substrate itself disadvantageously exhibits an increased linear thermal expansion coefficient. Further, the disperse phase formed by electrolytic etching has an increased longest diameter at the base thereof and the number of projections is reduced, making the diamond coat layer more likely to peel. Further, if the average longest diameter of the disperse phases present on the surface of the substrate thus etched exceeds the above-defined range, the rough surface of the substrate formed by electrolytic etching has larger but fewer projections. The reason for this phenomenon will be described with reference to FIGS. 1 and 2.

Figure 1:
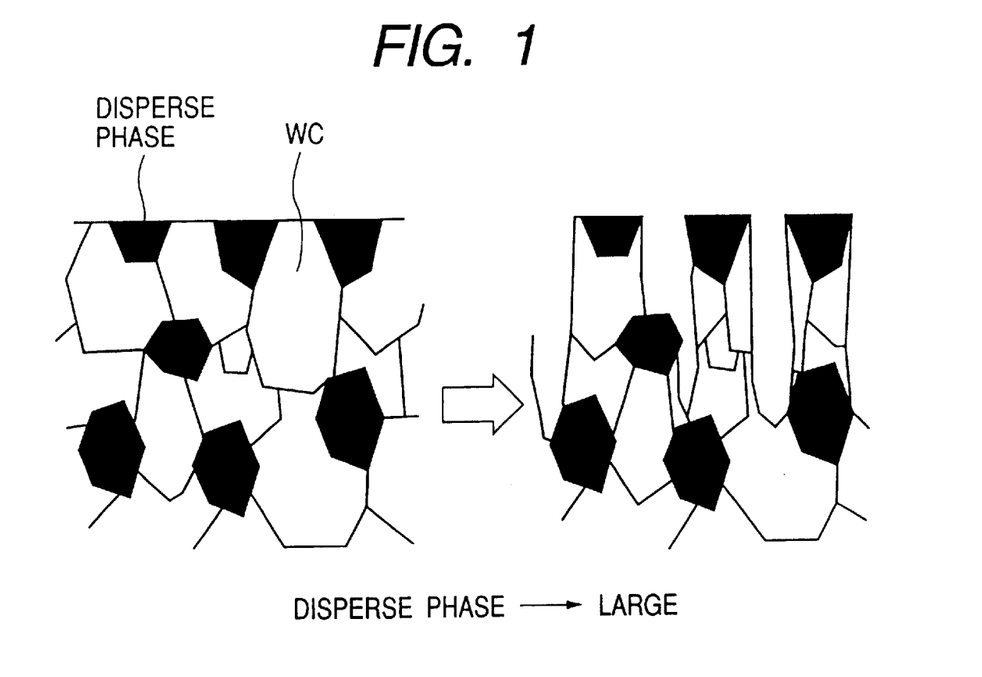
FIG. 1 illustrates how WC or binding phases (γ-phases, not shown) such as Co are eluted under the application of voltage, and projections are formed with disperse phases left uneluted as projections after electrolytic etching in the case where the size of disperse phases on the etched substrate is large.
Figure 2:
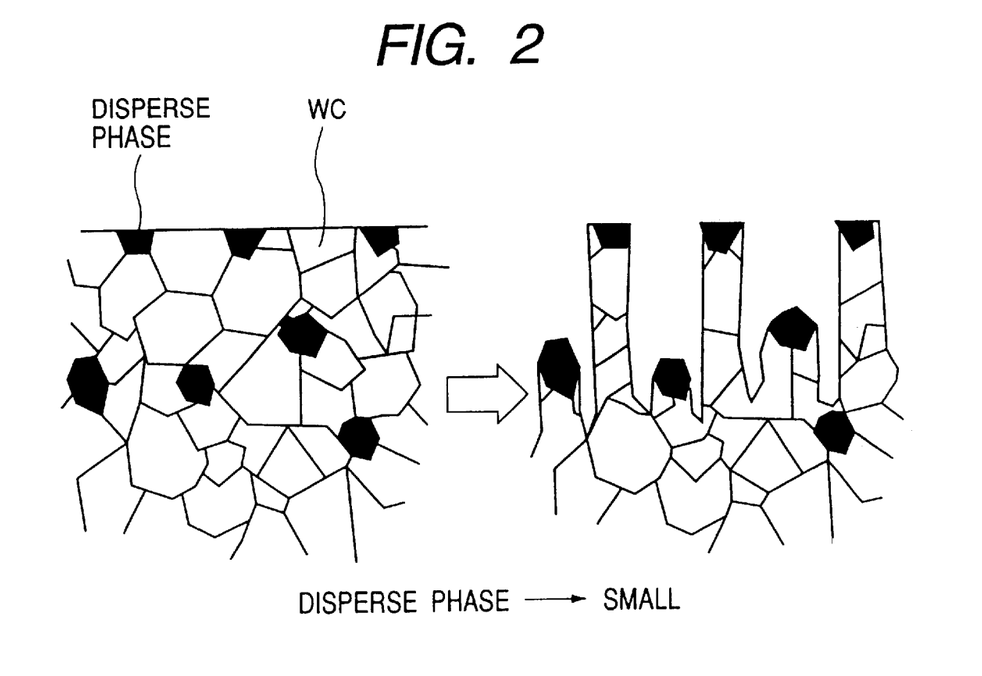
FIG. 2 illustrates how binding phases (not shown) such as WC and Co are eluted under the application of voltage, and projections are formed with disperse phases left uneluted as projections after electrolytic etching in the case where the size of disperse phases on the etched substrate is small.

FIGS. 1 and 2 are each diagrams illustrating how WC (shown as white portions in the figures) or binding phases such as Co (not shown) are eluted under the application of voltage and projections are then formed with disperse phases (shown as black portions in the figures) left uneluted as projections after electrolytic etching. FIG. 1 illustrates the case where the size of disperse phases is large, while FIG. 2 illustrates the case where the size of disperse phases is small.

As shown in FIGS. 1 and 2, even if the density of the disperse phases on the surface of the hard metal substrate (i.e., the number of disperse phases per unit area on the surface of the substrate) is the same, the roughened surface of the substrate formed by electrolytic etching has projections of different densities (i.e., number of projections per unit area) with different particle diameters of disperse phases (i.e., differences in longest diameter).

Thus, if the size of each of the disperse phases present on the surface of the unetched substrate (i.e., average longest diameter of disperse phases herein) is great, or if the density of disperse phases (i.e., number of disperse phases per unit surface area of substrate) is high even though the size of disperse phases is small, disperse phases interfere with each other in electrolytic etching. This reduces the number of projections on the roughened surface of the substrate formed by electrolytic etching, and hence the density of projections on the roughened surface of the substrate (i.e., number of projections per unit surface area).

Therefore, when electrolytically etched, a hard metal substrate having disperse phases with a particle diameter and density exceeding the range defined herein forms a roughened surface having projections with a greater longest diameter at the base thereof in a smaller number and hence a smaller density. Thus, a sufficient anchoring effect cannot be achieved.

Conversely, when electrolytically etched, a hard metal substrate having disperse phases to be projected after electrolytic etching with too small a size or in too small a density (i.e., number of disperse phases per unit surface area of the substrate) forms only small projections in a small density. Thus, a sufficient anchoring effect cannot be achieved.

For the measurement of the size and density of. disperse phases (disperse phase particles) on the surface of the unetched substrate and the size and density of projections in the roughened surface of the electrolytically etched substrate, SEM (scanning electron microscope) or the like can be used. The surface of the substrate can be observed by SEM to obtain an image that is then analyzed by an image analyzer. More specifically, the size and density of dispersed phases on the surface of the unetched substrate can be measured by utilizing a YZ-MOD image of SEM (JSM-840 manufactured by JEOL), and the size and density of projections in the roughened surface of electrolytically etched substrate can be measured by utilizing a TOPO image of SEM (JSM-840 manufactured by JEOL).

<Disperse phase>

The aforementioned disperse phase can contain one or more elements selected from the group consisting of elements belonging to Group IVa (Ti, Zr, Hf), Group Va (V, Nb, Ta) and Group VIa (Qr, Mo) excluding W, of the periodic table of elements. Preferably, the disperse phase can be made of one or more materials selected from one of the following three groups:

(1) One or more metals selected from the groups consisting of metals belonging to the Groups IVa, Va and VIa (excluding W) of the periodic table of elements.

(2) Compounds selected from the group consisting of carbide, nitride, boride and oxide, of the above metals, (e.g., a metal carbide), or a mixture of two or more of these compounds.

(3) Compounds produced by combining two or more of these carbides, nitrides, borides and oxides, or a mixture of two or more of these compounds.

The aforementioned unetched substrate may have the aforementioned disperse phases in a density defined herein. The unetched substrate can contain WC in its surface layer region at least to a depth that can be electrolytically etched in a content of from 60 to 95 mol-%, preferably from 65 to 90 mol-%, and more preferably from 70 to 85 mol-%. Further, the unetched substrate can contain binding phase components binding WC (and preferably one or more of Co and Ni) in a content of from 5 to 30 mol-%, preferably from 10 to 25 mol-%, and more preferably from 12 to 20 mol-%.

[Electrolytically Etched Hard Metal Substrate]

The roughened surface of the electrolytically etched substrate has fine, projections having an average longest diameter of not more than 3.2 $\mu$m, preferably 0.5 to 3.2 $\mu$m, more preferably 0.8 to 3.0 $\mu$m, most preferably 0.9 to 2.8 $\mu$m on the base thereof in a density as high as not less than 0.08/$\mu$m$^2$, preferably 0.08/$\mu$m$^2$ to 0.25/$\mu$m$^2$, more preferably 0.10/$\mu$m$^2$ to 0.20/$\mu$m$^2$, most preferably 0.12/$\mu$m$^2$ to 0.18/$\mu$m$^2$.

[Diamond Coat Layer]

The thickness of the diamond coat layer may be from 5 to 50 $\mu$m, preferably from 10 to 40 $\mu$m, and more preferably from 20 to 35 $\mu$m.

[Interlayer]

The thickness of the interlayer, if provided on the roughened surface of the hard metal substrate, is such that it can have a roughened surface corresponding to the roughened surface of the substrate when coating the substrate. The thickness is preferably from 0.1 to 0.5 $\mu$m, more preferably from 0.15 to 0.4 $\mu$m, and even more preferably from 0.2 to 0.3 $\mu$m.

Figure 3:
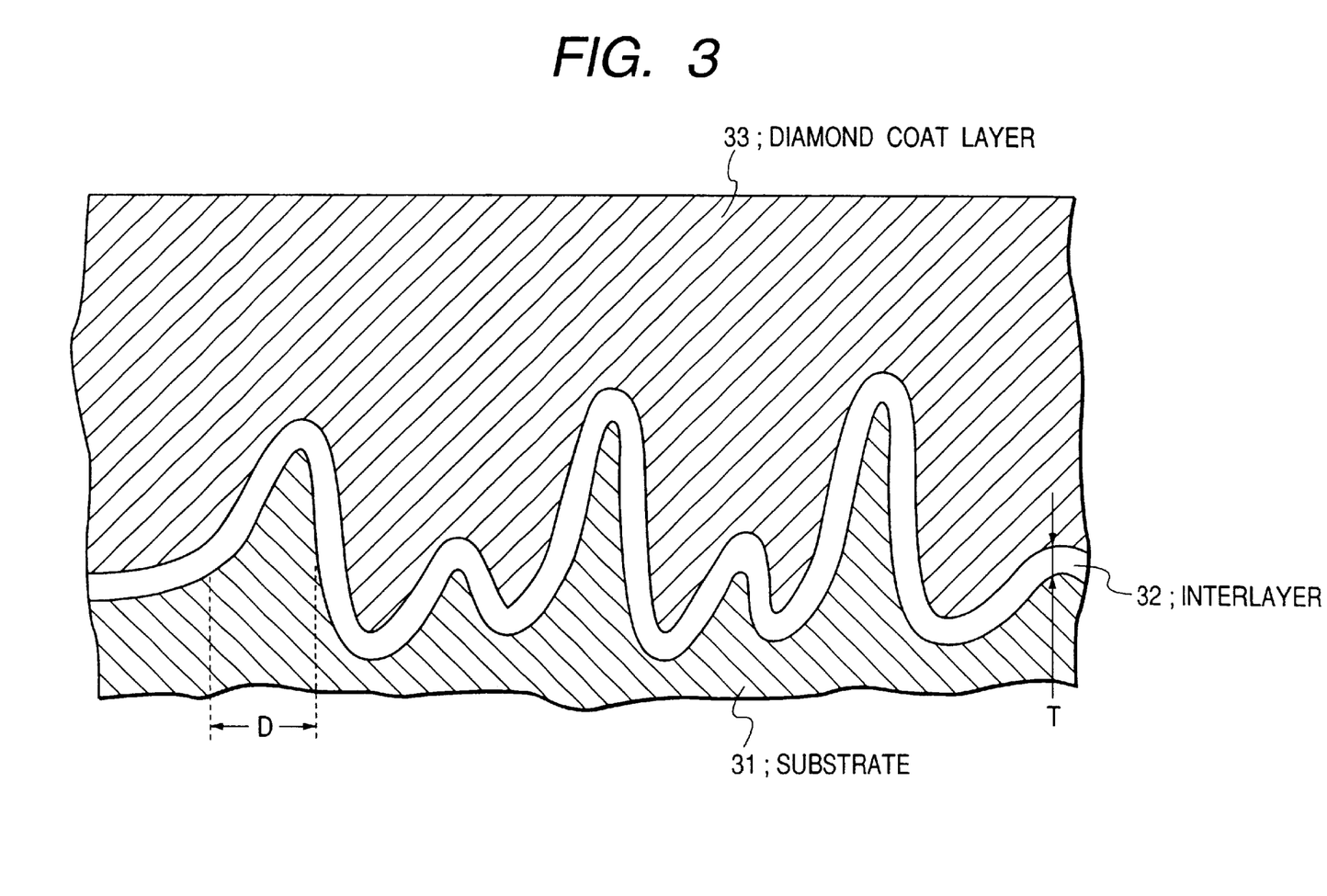
FIG. 3 illustrates the diamond coat layer in an embodiment of the diamond-coated hard metal member according to the present invention.

FIG. 3 is a vertical sectional view illustrating the diamond coat layer in an embodiment of the diamond-coated hard metal member according to the present invention. A substrate 31 has a roughened surface containing a projection having a longest diameter D at the base thereof. Formed on the roughened surface of the foregoing substrate is an interlayer 32 having a thickness of T and a roughened surface corresponding to the roughened surface of the substrate it coats. A diamond coat layer 33 is formed on the roughened surface of the interlayer to a thickness such that the projections from the roughened surface of the interlayer are hidden. The outer surface of the diamond coat layer is not as rough as on the interlayer side thereof, but is instead almost flat.

[Process for the Production of the Diamond-Coated Hard Metal Member]

[Process for the Formation of the Substrate]

The hard metal substrate to be electrolytically etched may be selected from commercial products (e.g., KT9, produced by DIJET INC., TH10, produced by TOSHIBA TUNGALOY CO., LTD., G10E, produced by Sumitomo Electric Industries, Ltd.). The hard metal substrate should contain a metal or metal compound, and comprise a disperse phase having a sufficiently lower electrolytic etching rate than WC generally dispersed therein in an amount of from 2 to 5 mol-%. The surface of the substrate should have small diameter disperse phases having an average longest diameter of from not less than 0.5 $\mu$m to less than 2 $\mu$m in a density of from not less than 0.1/$\mu$m$^2$ to not more than 0.2/$\mu$m$^2$, or large diameter disperse phases having an average longest diameter of from not less than 2 $\mu$m to not more than 3 $\mu$m in a density of from not less than 0.03/$\mu$m$^2$ to not more than 0.1/$\mu$m$^2$.

[Electrolytic etching]

A preferred embodiment of the electrolytic etching process for the formation of roughened surface on the hard metal substrate will be described hereinafter.

(1) As an electrolytic solution, an acidic or neutral solution is preferably used. More preferably, HCl or chlorinated alkali (particularly KCl as a neutral electrolytic solution) is used. An electric field can be applied to the substrate as an anode to form a roughened surface thereon.

(2) The current density is from 0.03 to 1.00 A/cm$^2$, and preferably from 0.07 to 0.80 A/cm$^2$.

(3) The concentration of the electrolytic solution is from 3 to 8 wt-%, and preferably from 4 to 6 wt-%.

(4) The etching time is from 5 to 30 minutes, preferably with the concentration of the electrolytic solution being from 4 to 6 wt-%. Even if etching is conducted for longer than 30 minutes, the resulting effect tends to be the same. On the contrary, if etching is conducted for less than 5 minutes, the resulting roughened surface of the substrate tends to have projections with a smaller size, making it impossible to sufficiently adhere the diamond coat layer to the substrate.

[Process for the Synthesis of Diamond Coat Layer]

<Pretreatment>

As a pretreatment process for the synthesis of a diamond coat layer on the surface of the electrolytically etched hard metal substrate, binding phase components are removed from the surface of the substrate with an acid so as to inhibit their effect. Then the surface of the substrate is masked with an interlayer or the substrate is placed in an acetone solution having diamond particulate (average particle diameter: 5 to 10 $\mu$m) dispersed therein and supersonically treated so as to produce small depressions along the roughened surface of the substrate. The interlayer, if provided on the substrate, may be subjected to this supersonic treatment.

As the process for the formation of the interlayer there may be used any suitable process, provided that it results in an interlayer having a thickness of, for example, from 0.1 to 0.5 $\mu$m. Examples of such a process include a high frequency sputtering process, a dc sputtering process, and a vacuum evaporation process.

<Synthesis Process>

As a process for the synthesis of a diamond coat layer on the foregoing electrolytically etched hard metal substrate (with or without the pretreatment discussed above), there may be used any suitable known process. Examples of this process include a diamond vapor phase synthesis method, a CVD method (chemical vapor deposition method), and a PVD method (physical vapor deposition method). Preferable processes include, for example, a hot filament process, a RF (high frequency) plasma CVD method, and a microwave plasma CVD method.

<Starting Material Gas>

As the starting material gas from which the diamond coat layer is synthesized, there may be used any suitable material from which the diamond coat layer can be synthesized. Examples of such a material include various carbides (e.g., methane, ethane, propane), alcohol (e.g., methanol, ethanol), CO and $CO_2$. These starting materials may be used singly or in a mixture, or may be diluted with hydrogen gas or an inert gas before use.

EXAMPLE 1

Figure 5:
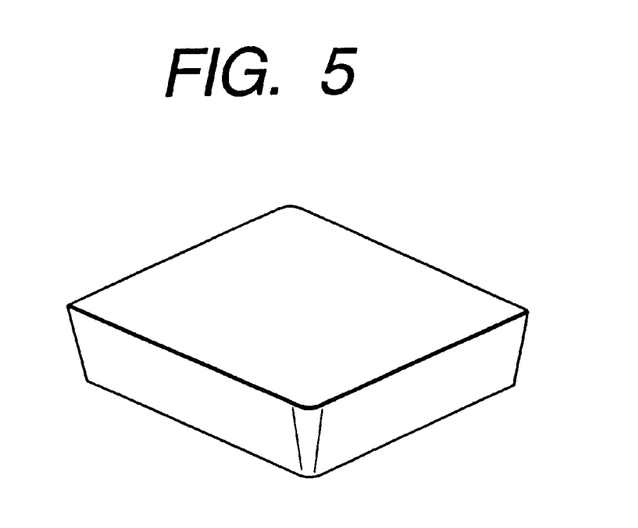
FIG. 5 is a hard metal cutting tip shaped according to ISO SPGN120308.

The sample Nos. 1 to 5 set forth in Table 1 were each made of a WC-Co-based hard metal cutting tip (shaped according to ISO SPGN120308, shown in FIG. 5) having disperse phase components uniformly dispersed therein. These samples were each subjected to electrolytic etching under the conditions described below. The term "wt-%" as used hereinafter is meant to indicate "% by weight." The term "vol-%" as used hereinafter is meant to indicate "% by volume."

Electrolytic solution: 5 wt-% KCl (25° C.)

Electrode: The aforementioned hard metal substrate served as an anode, and a carbon rod served as a cathode.

Current density: 0.15 A/cm$^2$

Processing time: 15 min

Figure 4:
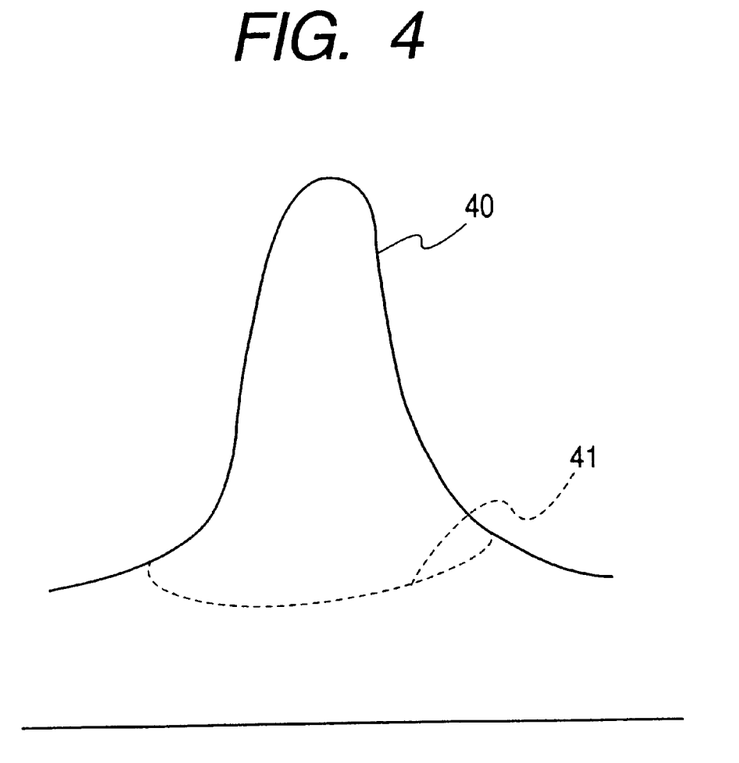
FIG. 4 is an enlarged view of the base of a projection.

The disperse phase content, average longest diameter (averaged over 300 disperse phases on the surface of the substrate) and density of the unetched substrate in Sample Nos. 1 to 5, along with the average longest diameter (averaged over 300 projections at the base thereof) and density of projections in the roughened surface of the electrolytically etched substrate, are set forth in Table 1. As can be seen in Table 1, each of these samples was observed to have a roughened surface comprising a high density of small projections formed by electrolytic etching. FIG. 4 illustrates the base 41 of a projection 41 on the roughened surface of the substrate.

A W interlayer was then vacuum-evaporated onto the roughened surface of the substrate to a thickness of 0.2 μm under the following conditions:

Degree of vacuum: $10^{-2}$ torr

Substrate temperature: 300° C.

Deposition rate: 1 nm/min

Thereafter, the roughened substrate was subjected to a supersonic treatment while being dipped in a solvent including diamond particulate having an average particle diameter of 10 μm dispersed therein, so as to create small depressions in the roughened surface of the substrate. A diamond-coated cutting tip was prepared by placing the supersonically-treated substrate in a 2.45 GHz microwave plasma CVD apparatus where a diamond coat layer was then formed thereon to a thickness of about 20 μm under the following two-stage synthesis conditions.

1st Stage (Formation of Diamond Coat Layer)

Gas used: 5 vol-%CO-95 vol-%$H_2$

Gas flow rate: 100 cc/min

Reaction chamber pressure: 40 torr

Substrate temperature: 900° C.

Synthesis time: 3 hr

2nd Stage (Growth of Diamond Coat Layer)

Gas used: 15 vol-%CO-85 vol-%$H_2$

Gas flow rate: 100 cc/min

Reaction chamber pressure: 40 torr

Substrate temperature: 900° C.

Synthesis time: 7 hr

As a milling machine, these diamond-coated cutting tips were each evaluated for adhesion of the diamond coat layer according to an intermittent cutting test (on a rectangular object having a size of about 150 mm×150 mm×50 mm) under the conditions shown below. The diamond-coated cutting tip according to the present invention could work on an object for an extended period of time without the diamond coat layer peeling, thus showing excellent cutting properties.

Object to be cut: Al-18 wt-% Si alloy

Cutting speed: 600 m/min

Feed rate: 0.1 mm/tooth

Notch: 0.5 mm

Comparative Example 1

Electrolytic etching was effected in the same manner as in Example 1, except that the substrates were made of different WC-Co-based hard metals. The disperse phase contents, average longest diameters (averaged over 300 disperse phases on the surface of the substrate) and densities of the substrates are shown in Sample Nos. 6 and 7 of Table 1. The average longest diameter (averaged over 300 projections at the base thereof) and density of projections in the roughened surface of the electrolytically etched substrates are also set forth in Table 1.

A diamond coat layer was formed on these substrates in the same manner as in Example 1. The cutting tips obtained were each subjected to a cutting test. Since Sample No. 6 had disperse phases with too great a size, and Sample No. 7 had disperse phases in a high density, the samples formed projections having a great longest diameter on the surface thereof in a low density, as shown in Table 1, when electrolytically etched. Thus, sufficient adhesion of the diamond coat layer to the substrate could not be obtained. When subjected to the cutting test, the diamond coat layers of each of the two samples peeled in a short period of time.

Comparative Example 2

Electrolytic etching and synthesis of diamond coat layers were effected in the same manner as in Example 1, except that as the substrate, there were used various WC-Co-based hard metals having a disperse phase content, average longest diameter (averaged over 300 disperse phases on the surface of the substrate) and density, as shown in Sample Nos. 8 to 11 of Table 1. The average longest diameter (averaged over 300 projection at the base thereof) and density of projections on the roughened surface of the electrolytically etched substrates are also set forth in Table 1.

A diamond coat layer was formed on these substrates in the same manner as in Example 1. The cutting tips thus prepared were each then subjected to a cutting test in the same manner as in Example 1. Since the unetched substrates of Sample Nos. 8 and 9 had too great a disperse phase content and hence too great a disperse phase density, they formed a roughened surface comprising larger projections in a smaller density when electrolytically etched. Thus, sufficient adhesion could not be obtained. When subjected to the cutting test, these samples showed abrasion or peeling in a short period of time. Further, since the unetched substrates of Sample Nos. 10 and 11 had too small a disperse phase content and hence an extremely low disperse phase density, they formed a roughened surface comprising projections in a low density when electrolytically etched. Thus, little or no anchoring effect could be obtained. The diamond coat layer, which had been synthesized, spontaneously peeled off of the substrates during cooling. Accordingly, these samples could not be subjected to a cutting test.

TABLE 1

| | | Disperse phase | | | Projection on roughened surface | | | |
|---|---|---|---|---|---|---|---|---|
| Sample No. | | Content (mol-%) | Average longest diameter (μm) | Density (/μm$^2$) | Average longest diameter (μm) | Density (/μm$^2$) | Cutting time (min) | Remarks |
| Example 1 | 1 | 3.0 | 1.8 | 0.10 | 2.6 | 0.13 | >130 | Normal abrasion |
| | 2 | 3.1 | 1.8 | 0.14 | 2.3 | 0.19 | >130 | " |
| | 3 | 2.9 | 1.2 | 0.11 | 2.4 | 0.10 | >130 | " |
| | 4 | 2.8 | 2.7 | 0.05 | 2.9 | 0.19 | >130 | " |
| | 5 | 3.2 | 2.3 | 0.07 | 2.5 | 0.12 | >130 | " |

TABLE 1-continued

| | | Disperse phase | | Projection on roughened surface | | | |
|---|---|---|---|---|---|---|---|
| Sample No. | Content (mol-%) | Average longest diameter ($\mu$m) | Density (/$\mu$m$^2$) | Average longest diameter ($\mu$m) | Density (/$\mu$m$^2$) | Cutting time (min) | Remarks |
| Comparative Example 1 | 6 | 3.2 | 3.8 | 0.05 | 3.6 | 0.07 | <60 | Peeled |
| | 7 | 2.5 | 0.5 | 0.84 | 4.8 | 0.05 | <20 | " |
| Comparative Example 2 | 8 | 12.8 | 2.2 | 0.10 | 3.9 | 0.09 | <90 | Normal abrasion |
| | 9 | 21.4 | 1.6 | 0.64 | 5.2 | 0.06 | <10 | Peeled |
| | 10 | 1.85 | 1.2 | 0.06 | 2.6 | 0.03 | — | Spontaneously peeled |
| | 11 | 0.25 | 0.9 | 0.01 | 1.5 | 0.01 | — | Spontaneously peeled |

For the measurement of the longest diameter of a projection on the roughened surface of the substrate at the base thereof, the mirror-finished surface of the substrate was photographed by SEM (JSM-840 manufactured by JEOL). The disperse phases in the SEM photograph thus obtained were then traced on an overhead transparency sheet. The traced image was taken by a Type LUZEXIII image analyzer manufactured by NIRECO Co., Ltd. The image was analyzed (measured for dimension) to find the maximum diameter portions which were then measured to determine the longest diameter of a projection.

Accordingly, the foregoing diamond-coated hard metal member according to the present invention can exhibit an adhesion good enough to withstand impact developed when the element is used as a cutting tool for heavy-duty cutting, such as milling of aluminum alloy.

What is claimed is:

1. A diamond-coated hard metal member, comprising:
    a hard metal substrate having a roughened surface; and
    a diamond coat layer coating the roughened surface of said substrate, either directly or with an interlayer containing a metal or metal compound interposed therebetween;
    wherein said substrate has fine projections having an average diameter of not more than 3.2 $\mu$m at the base thereof in a density of not less than 0.12/$\mu$m$^2$, and said diamond coat layer or interlayer that directly coats said substrate has a roughened surface corresponding to the roughened surface of said substrate.

2. A diamond-coated hard metal member, comprising:
    a hard metal substrate having a roughened surface; and
    a diamond coat layer coating the roughened surface of said substrate, either directly or with an interlayer containing a metal or metal compound interposed therebetween;
    wherein the roughened surface of said substrate is obtained by electrolytically etching a WC-based hard metal substrate comprising WC as a main component, said substrate contains an unetched portion having a metal element or metal compound and comprises a disperse phase having a sufficiently lower electrolytic etching rate than the WC dispersed therein in a surface region to at least a thickness that can be electrolytically etched in an amount of from 2 to 5 mol-%, and the surface of said unetched substrate has small diameter disperse phases having an average diameter of from not less than 0.5 $\mu$m to less than 2 $\mu$m in a density of from not less than 0.1/$\mu$m$^2$ to not more than 0.2/$\mu$m$^2$ or large diameter disperse phases having an average diameter of from not less than 2 $\mu$m to not more than 3 $\mu$m in a density of from not less than 0.03/$\mu$m$^2$ to not more than 0.1/$\mu$m$^2$, and said diamond coat layer or interlayer that directly coats said substrate has a roughened surface corresponding to the roughened surface of said substrate.

3. The diamond-coated hard metal member according to claim 2, wherein the roughened surface of said substrate has fine projections having an average diameter of not more than 3.2 $\mu$m at the base thereof in a density as high as not less than 0.12/$\mu$m$^2$.

4. The diamond-coated hard metal member according to claim 2, wherein the disperse phase contains at least one metal element selected from the group consisting of elements belonging to Groups IVa, Va and VIa (excluding W) of the periodic table of elements, or a compound thereof.

5. The diamond-coated hard metal member according to claim 3, wherein the disperse phase contains at least one metal element selected from the group consisting of elements belonging to Groups IVa, Va and VIa (excluding W) of the periodic table of elements, or a compound thereof.

6. The diamond-coated hard metal member according to claim 1, wherein said hard metal member is a cutting tip.

7. A process for producing a diamond-coated member, comprising the steps of:
    forming a hard metal substrate containing a disperse phase having a lower electrolytic etching rate than WC dispersed in the substrate;
    electrolytically etching the hard metal substrate to form fine projections having an average diameter of not more than 3.2 $\mu$m at the base thereof in a density of not less than 0.12/$\mu$m$^2$; and
    forming a diamond coat layer on the surface of the electrolytically etched hard metal substrate, either directly or with an interlayer containing a metal or metal compound interposed therebetween, wherein the diamond coat layer or interlayer that directly coats the substrate has a roughened surface corresponding to the roughened surface of the substrate.

8. The process for producing a diamond-coated member according to claim 7, wherein the diamond coat layer forming step includes a pretreatment process comprising the steps of:
    removing binding phase components from the surface of the substrate;
    placing the substrate in an acetone solution having diamond particulate dispersed therein, and supersonically treating the substrate so as to produce small depressions along the projection-bearing surface of the electrolytically etched substrate.

9. A process for producing a diamond-coating member, comprising the steps of:

forming a hard metal substrate containing a disperse phase having a lower electrolytic etching rate than WC dispersed therein in a surface region to at least a thickness that can be electrolytically etched in an amount of from 2 to 5 mol-%, wherein the surface of the substrate has small diameter disperse phases having an average diameter of from not less than 0.5 $\mu$m to less than 2 $\mu$m in a density of from not less than 0.1/$\mu m^2$ to not more than 0.2/$\mu m^2$ or large diameter disperse phases having an average diameter of from not less than 2 $\mu$m to not more than 3 $\mu$m in a density of from not less than 0.03/$\mu m^2$ to not more than 0.1/$\mu m^2$;

electrolytically etching the substrate to form a roughened surface thereon; and forming a diamond coat layer on the roughened surface of the substrate, either directly or with an interlayer containing a metal or metal compound interposed therebetween, wherein the diamond coat layer or interlayer that directly coats the substrate has a roughened surface corresponding to the roughened surface of the substrate.

* * * * *